United States Patent
Bowers et al.

(10) Patent No.: US 8,698,544 B2
(45) Date of Patent: Apr. 15, 2014

(54) DYNAMIC IMPROVEMENT IN RMS TO DC CONVERTERS

(75) Inventors: Derek Bowers, Los Altos Hills, CA (US); Lewis Counts, Lexington, MA (US); James G. Staley, Maynard, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/417,694

(22) Filed: Mar. 12, 2012

(65) Prior Publication Data

US 2013/0234775 A1    Sep. 12, 2013

(51) Int. Cl.
*G06G 7/20*    (2006.01)

(52) U.S. Cl.
USPC ............................ 327/348; 327/347; 327/349

(58) Field of Classification Search
USPC .................................. 327/346–354
See application file for complete search history.

(56) References Cited

U.S. PATENT DOCUMENTS

| | | | |
|---|---|---|---|
| 4,703,174 A * | 10/1987 | Anderson et al. | 250/227.21 |
| 4,783,635 A * | 11/1988 | Sevastopoulos | 330/107 |
| 5,986,434 A | 11/1999 | Roy et al. | |
| 6,437,630 B1 | 8/2002 | Gilbert | |
| 6,549,057 B1 | 4/2003 | Gilberg | |
| 6,597,942 B1 * | 7/2003 | Yonce | 600/509 |
| 6,801,005 B2 | 10/2004 | Charleston | |
| 6,856,185 B2 | 2/2005 | Sully | |
| 7,002,394 B1 * | 2/2006 | Gilbert | 327/349 |
| 7,106,604 B2 | 9/2006 | Nash | |
| 7,342,431 B2 | 3/2008 | Zou | |
| 7,675,244 B2 | 3/2010 | Blondia | |
| 7,777,552 B1 | 8/2010 | Gilberg | |
| 7,859,872 B1 | 12/2010 | Johns | |
| 7,978,483 B2 | 7/2011 | Mazzola et al. | |
| 2004/0223349 A1 | 11/2004 | Nash | |

FOREIGN PATENT DOCUMENTS

WO        WO0002741 A1    1/2000

OTHER PUBLICATIONS

International Search Report of the International Search Authority in PCT/US2013/030142, dated Jun. 14, 2013, 4 pages.
Kitchin, et al., "RMS to DC Conversion Application Guide", 2nd Edition, 1986, 21 pages (available at World Wide Web page: analog.com/static/imported-files/design_handbooks).
Liu et al, "A Kind of Switch Current Source with High Order LC Filter Output", 2010 International Conference on Communications Circuits and Systems (ICCCAS), IEEE, Piscataway, NJ, USA, Jul. 28, 2010, pp. 518-521.

* cited by examiner

*Primary Examiner* — Dinh T. Le
(74) *Attorney, Agent, or Firm* — Knobbe Martens Olson & Bear LLP

(57) ABSTRACT

A circuit for providing a DC output equal to the RMS value of a time-varying input signal, the circuit including: (i) an RMS-to-DC converter for producing the DC output and (ii) a high-order low-pass filter comprising at least first and second low-pass filters connected in series to cooperatively reduce at least one of ripple in the DC output, ripple in an denominator feedback loop, or DC error in the DC output.

22 Claims, 9 Drawing Sheets

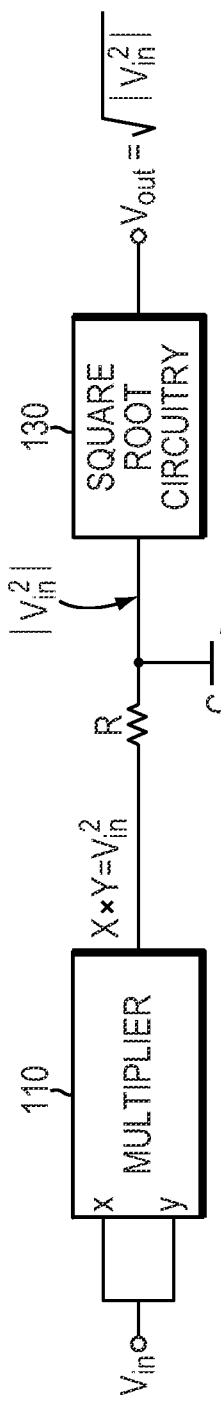
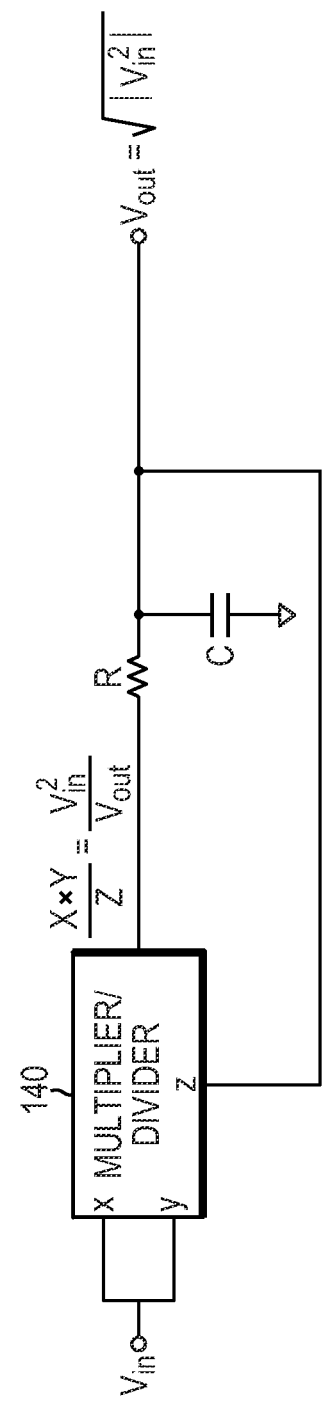
FIG. 1A PRIOR ART
FIG. 1B PRIOR ART

DYNAMIC IMPROVEMENT IN RMS TO DC CONVERTERS

FIELD OF THE INVENTION

Embodiments of the present invention generally relate to converters and, in particular, to root-mean-square (RMS)-to-direct current (DC) converters.

BACKGROUND

RMS is a fundamental measurement of the magnitude of an alternating current (AC) signal. Defined practically, the RMS value assigned to an AC signal is the amount of DC required to produce an equivalent amount of heat in the same load. For example, an AC signal of 1 volt RMS produces the same amount of heat in a resistor as a 1 volt DC signal. Defined mathematically, the RMS value of a voltage is obtained by squaring the signal, taking the average, and then taking the square root. RMS-to-DC converters provide a DC output equal to the RMS value of an AC or fluctuating DC input. Conventionally, there are two basic techniques used in RMS-to-DC converters: explicit and implicit approaches.

The explicit method computes the RMS value of an input signal using a straight-forward approach, as depicted in FIG. 1A. The input signal is first squared by a multiplier 110. The average value is then taken by using an appropriate filter 120, and the square root is obtained using circuitry 130 containing at least an operational amplifier with a second squarer in the feedback loop. This explicit circuit has limited dynamic range because the stage following the multiplier 110 deals with a signal that varies enormously in amplitude. For example, an input signal with a dynamic range of 100 to 1 (e.g., 10 mV to 1 V) has a dynamic range of 10,000 to 1 at the output of the multiplier 110. This disadvantage thus restricts the explicit method to inputs with a limited dynamic range.

A generally better computing scheme uses feedback to perform the square root function implicitly at the input of the circuit as illustrated in FIG. 1B. The output is fed back to the direct-divide input of a multiplier 140. In this circuit, the output of the multiplier/divider 140 varies linearly with (instead of as the square of) the RMS value of the input. This approach thus considerably increases the dynamic range of the implicit circuit, as compared to the explicit circuit. Additionally, implicit RMS computation advantageously involves fewer components and thus lower cost.

In both explicit and implicit RMS-to-DC converters, however, the ideal DC output voltage that exactly equals the RMS value of its input voltage, regardless of the amplitude, frequency, or wave shape of the input waveform, is never achieved; instead, the output voltage usually contains some errors, for example, an AC component. The AC component, which may be present as a ripple waveform as depicted in FIG. 2, results from incomplete suppression of the alternating waveform shape within the RMS-to-DC converter. One approach to reducing the ripple is to use a low-pass filter having a long time constant. Since the ripple is inversely proportional to the time constant, a tenfold increase in this time constant, for example, will effect a tenfold reduction in ripple. However, using a long time constant filter also proportionally increases the settling time for a change in input level. A long settling time increases the processing time of the converter, since the converter output will take longer to adjust to a change in RMS level.

Accordingly, a more popular approach for reducing output ripple is to use a "post-filter." A post-filter may be no more than a low-pass filter connected to the output pin of the RMS-to-DC converter. Post-conversion filtering may reduce the output ripple of a frequency higher than the cutoff frequency of the post-filter; however, the post-filter does not reduce the DC error due to finite averaging time (or averaging error) and the ripple reduction may still be insufficient for certain devices (e.g., a high-resolution analog-to-digital converter (ADC)) that require a highly certain output DC signal. Conventionally, this problem may be solved by using a multipole post-filter or two RMS-to-DC converters connected in series or in parallel; however, these approaches require a more complicated circuitry design and have extra costs associated with the second converter. Consequently, there is a need for a circuit that effectively and economically suppresses the output ripple of an RMS-to-DC converter.

SUMMARY

It has been found that the output ripple of an RMS-to-DC converter may be reduced using a high-order filter, for example, a two-pole low-pass filter connected in series in the converter without affecting the converted DC output or unduly increasing the settling time. Suitable circuits in accordance with the present invention are efficiently and cost-effectively implemented; a high-order low-pass filter may be as simple as two low-pass filters connected in series, each having a resistor and a capacitor to cooperatively reduce the output ripple. Unlike the post-filter that reduces only the output ripple, the high-order filter in the current invention may additionally effectively reduce ripple in the denominator feedback loop and/or the DC error due to finite averaging time. The high-order filter may be used in combination with a post-filter to reduce the output ripple of the RMS-to-DC converter.

The separation of two cutoff frequencies of the two low-pass filters may be adjusted based on the waveform of the signal to achieve a maximum ripple reduction. For example, a separation ratio ranging from roughly 6:1 to 10:1 may be used in various waveform signals to optimally suppress the ripple from, for example, 4.2% to 0.5%. In addition, a high-order low-pass filter incorporated in the RMS-to-DC converter may significantly reduce additional errors introduced to the output signal due to the low duty cycle (or high crest factor) of the RMS-to-DC converter.

Accordingly, in one aspect, a circuit for providing a DC output equal to the RMS value of a time-varying input signal includes an RMS-to-DC converter for producing the DC output and a high-order low-pass filter including at least first and second low-pass filters connected in series to cooperatively reduce at least one of ripple in the DC output, ripple in a denominator feedback loop, or DC error in the DC output. The RMS-to-DC converter may include: (i) a voltage-to-current converter, (ii) an absolute value circuit and (iii) a translinear circuit including a squarer/divider circuit and a current mirror circuit. The squarer/divider circuit may generate a current proportional to an RMS value of the input signal and the current mirror circuit may copy the current generated by the squarer/divider circuit. The circuit may further include a post-filter to reduce ripple in the DC output cooperatively with the high-order low-pass filter.

The high-order low-pass filter may be connected between the squarer/divider circuit and the current mirror circuit. More specifically, the high-order low-pass filter may be connected in series with the denominator feedback loop comprising at least a transistor in the current mirror circuit and a transistor in the squarer/divider circuit.

The first low-pass filter may include at least a first resistor and a first capacitor and the second low-pass filter may include at least a second resistor and a second capacitor. At least one of the first resistor, the first capacitor, the second resistor and the second capacitor may be located inside a housing or package that contains at least a part of the translinear circuit. In addition, at least one of the first resistor, the first capacitor, the second resistor and the second capacitor may be located outside a housing or package that contains at least a part of the translinear circuit.

In a second aspect, a circuit for providing a DC output equal to the RMS value of a time-varying input signal includes: (i) an RMS-to-DC converter for producing the DC output, (ii) an amplifier for negating effects of a variation in a dynamic emitter resistance of a transistor in a current mirror circuit of the RMS-to-DC converter, and (iii) a low-pass filter to reduce at least one of ripple in the DC output, ripple in a denominator feedback loop, or DC error in the DC output. The low-pass filter may include a resistor and a capacitor or may be a high-order low-pass filter. The high-order low-pass filter may include at least first and second low-pass filters that themselves each comprises a resistor connected in series with a signal and a capacitor connected between one end of the resistor and an analog common. The RMS-to-DC converter may include: (i) a voltage-to-current converter, (ii) an absolute value circuit and (iii) a translinear circuit including a squarer/divider circuit and a current mirror circuit. The squarer/divider circuit may generate a current proportional to an RMS value of the input signal and the current mirror circuit may copy the current generated by the squarer/divider circuit. The low-pass filter may be connected in series with the denominator feedback loop comprising at least a transistor in the current mirror circuit and a transistor in the squarer/divider circuit.

In a third aspect, a circuit for reducing at least one of ripple in the DC output, ripple in a denominator feedback loop, or DC error in the DC output in an RMS-to-DC converter having (i) a squarer/divider circuit for generating a current proportional to an RMS value of a time-varying input signal and (ii) a current mirror circuit for copying the current generated by the squarer/divider circuit, the circuit for reducing output ripple may include, connected between the squarer/divider circuit and the current mirror circuit, a high-order low-pass filter including at least first and second low-pass filters connected in series to cooperatively reduce at least one of the ripple in the DC output, ripple in the denominator feedback loop, or DC error in the DC output. The high-order low-pass filter may be connected in series with the denominator feedback loop comprising at least a transistor in the current mirror circuit and a transistor in the squarer/divider circuit.

The first low-pass filter may include at least a first resistor and a first capacitor and the second low-pass filter may include at least a second resistor and a second capacitor. At least one of the first resistor, the first capacitor, the second resistor and the second capacitor may be located inside a housing or package that contains at least a part of the translinear circuit. In addition, at least one of the first resistor, the first capacitor, the second resistor and the second capacitor is located outside a housing or package that contains at least a part of the translinear circuit.

In a fourth aspect, a method of providing a DC output equal to the RMS value of a time-varying input signal includes the steps of: (i) converting a voltage of the input signal into a current proportional thereto, and (ii) filtering the current through a high-order low-pass filter comprising at least first and second low-pass filters connected in series to cooperatively reduce at least one of output ripple in the current, ripple in a denominator feedback loop, or DC error in the DC output, wherein the current providing the DC output.

As used herein, the term "roughly" means±10% (e.g., by amplitude), and in some embodiments, ±5%. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which:

FIGS. 1A and 1B schematically illustrate explicit and implicit circuits, respectively, for RMS-to-DC conversion in accordance with the prior art;

DETAILED DESCRIPTION

Figure 2:
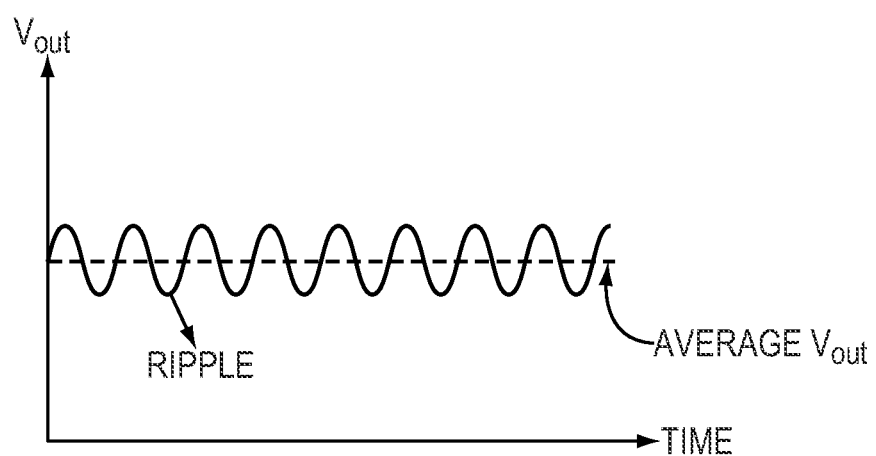
FIG. 2 is a ripple-containing converted DC output of a sinusoidal input signal.
Figure 3:
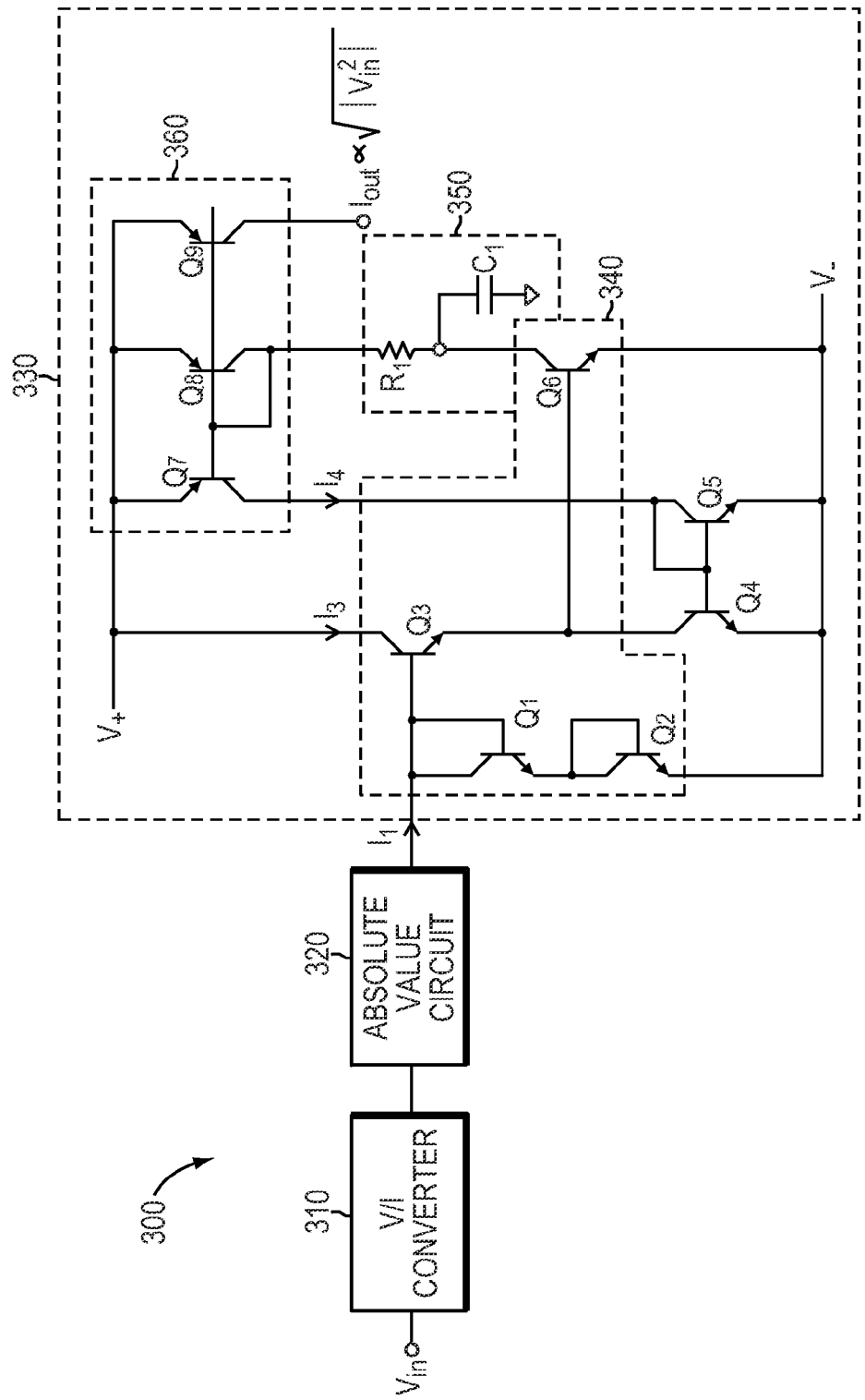
FIG. 3 schematically illustrates circuitry of an implicit RMS-to-DC converter using a single-pole low-pass filter to reduce the output ripple in a prior-art configuration.

Refer first to FIG. 3, which illustrates a conventional implicit RMS-to-DC converter 300 that includes a voltage-to-current converter 310 (e.g., a precision resistor), an absolute value circuit 320 (e.g., an active rectifier), and a translinear circuit 330. The voltage-to-current converter 310 first converts the input voltage, which may be AC or DC, to a current. The current signal is then rectified by the absolute value circuit 320. The rectified, unipolar current $I_1$ drives one input of a squarer/divider circuit 340, which has the transfer function $I_4=I_1^2/I_3$ for performing the implicit RMS computation. The input rectification may introduce a residual ripple AC component at the output of the RMS-to-DC converter and thus results in, for example, one or more least significant bits (LSBs) cycling and/or low-value display numerals flashing in an ADC. In one embodiment, the RMS-to-DC converter 300 includes an averaging-filter 350 to compute the mean of the sum of the squares. Ripple reduction following the conversion may be performed in the output of the converter 300 using a post-filter (not shown). The averaging-filter 350 may be as simple as a single-pole low-pass filter that includes a resistor, $R_1$, and a capacitor, $C_1$. Signals with frequencies above the cutoff frequency, f, of the low-pass filter are attenuated, while signals with frequencies below f have little attenuation. The cutoff frequency, f, is determined by the RC time constant $$R_{Q8} = \frac{\kappa T}{q I_C}$$

where $$f = \frac{1}{2\pi(R_1 + R_{Q8})C_1},$$

is the dynamic emitter resistance of the transistor Q8 in a current mirror circuit 360, which causes the current output $I_{out}$ to mirror the current $I_4$ (which, as discussed above, is proportional to $\sqrt{|V_{in}^2|}$). (In the formula for $R_{Q8}$, $\kappa$, T, q, and $I_C$ are the Boltzmann constant, temperature, charge, and collector current, respectively.) Because the current $I_4$ is linearly proportional to the output current $I_{out}$ and any filtering that affects $I_{out}$ will equally affect $I_4$, current $I_4$ functions as a feedback current for the implicit RMS computation. The resistor $R_1$ and the capacitor $C_1$ may be located inside or outside of a housing or package that contains at least the squarer/divider circuit 340.

Figure 4A:
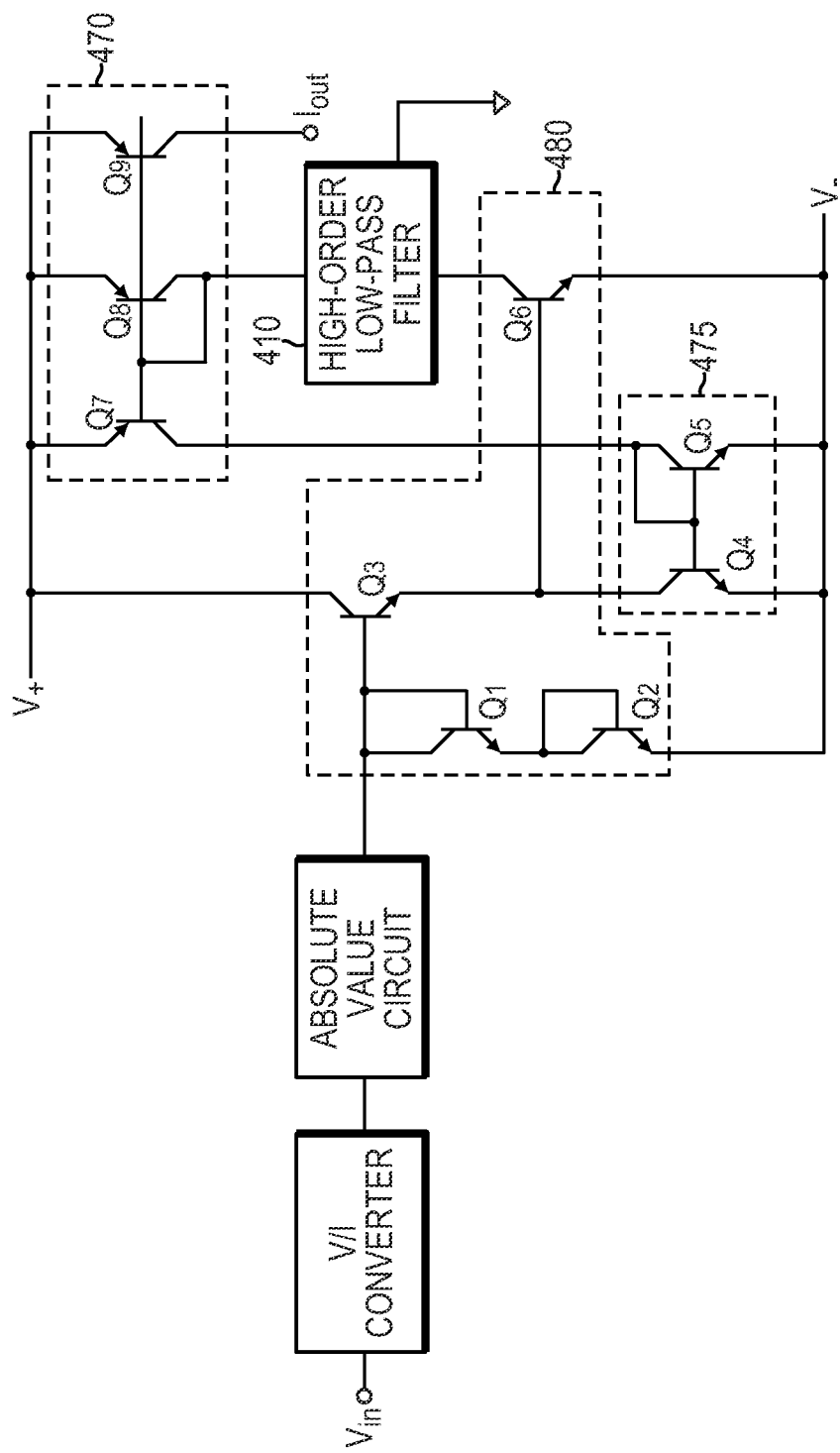
FIG. 4A depicts circuitry of an implicit RMS-to-DC converter using a high-order low-pass filter to reduce the output ripple.
Figure 4B:
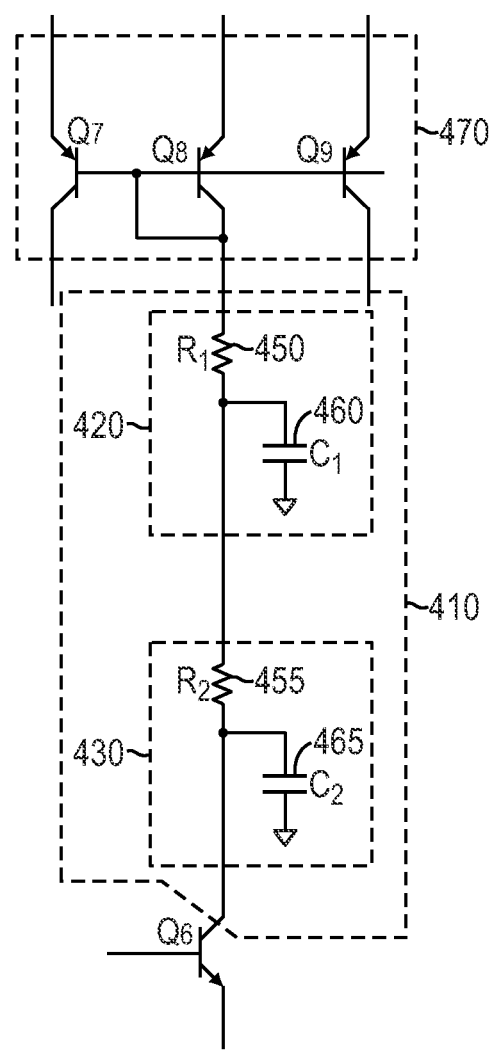
FIG. 4B depicts detailed circuitry of the two-pole low-pass filter.

FIG. 4A illustrates a representative embodiment of the present invention in which the RMS-to-DC converter incorporates a high-order low-pass filter 410 to further reduce the output ripple. In one implementation, the high-order low-pass filter 410 is a two-pole low-pass filter that includes two low-pass filters 420, 430 connected in series to cooperatively filter the output ripple, as illustrated in FIG. 4B. Each low-pass filter 420, 430 may be as simple as a resistor $R_1$ 450 (or $R_2$ 455) and a capacitor $C_1$ 460 (or $C_2$ 465). The two low-pass filters 420, 430 may be connected in series with a transistor (e.g., $Q_8$) in the current mirror circuit 470 and a transistor (e.g., $Q_6$) that squares the input signals. Each component 450, 455, 460, 465 of the two-pole low-pass filter may be located inside or outside a housing or package that contains at least a part of the squarer/divider circuit 480. The high-order low-pass filters 410 may be connected in series with the denominator computation feedback loop that includes current mirror circuits 470, 475 and the denominator, $Q_3$, of the squarer/divider. The high-order low-pass filters may improve the averaging and thus reduces the output ripple, the ripple that is fedback into the denominator, and/or the DC component of the averaging error. In one embodiment, capacitor values $C_1$ and $C_2$ are significantly less than the equivalent averaging capacitor value for the same level of ripple reduction. Capacitors $C_1$ and $C_2$ in the two-pole low-pass filters may be surface-mount tantalums, and/or metalized polyester or similar film styles, for best performance; additionally, these types of capacitors may have low DC leakage. The first and second low-pass filters 420, 430 have cutoff frequencies of $$f_1\left(f_1 = \frac{1}{2\pi R_1 C_1}\right) \text{ and } f_2\left(f_2 = \frac{1}{2\pi R_2 C_2}\right),$$

respectively. The cutoff frequencies may be adjusted to have a separation ratio that maximizes the suppression of the output ripple based on the shape of the signal waveform. For example, a separation ratio ranging from roughly 6:1 to 10:1 may be used to optimally reduce the ripple of various waveforms. The separation ratio is critical for keeping the feedback loop stable. Because adding a single-pole filter generates a 90° phase shift of the output signal, adding the two-pole filters potentially may add a 180° phase shift to the output signal and result in oscillation of the feedback loop. Setting the separation ratio to be between 6:1 and 10:1 may maintain stability of the feedback loop. In some embodiments, the high-order low-pass filter 410 and the post-filter (not shown) cooperatively filter the output ripple.

Figure 5A:
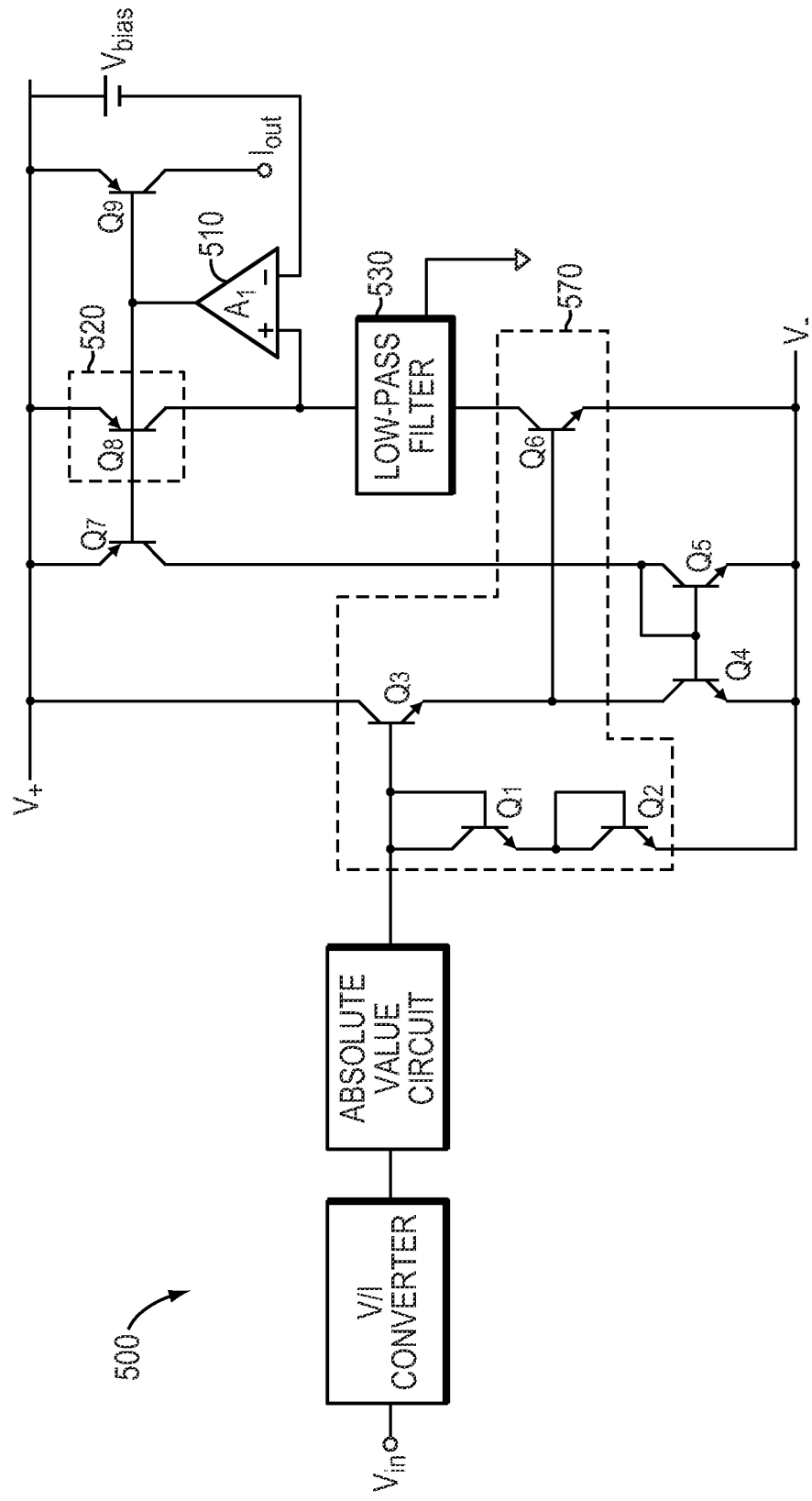
FIG. 5A illustrates circuitry of an implicit RMS-to-DC converter including an amplifier to negate the effect of a variation in a dynamic emitter resistance and a low-pass filter to reduce the output ripple.
Figure 5B:
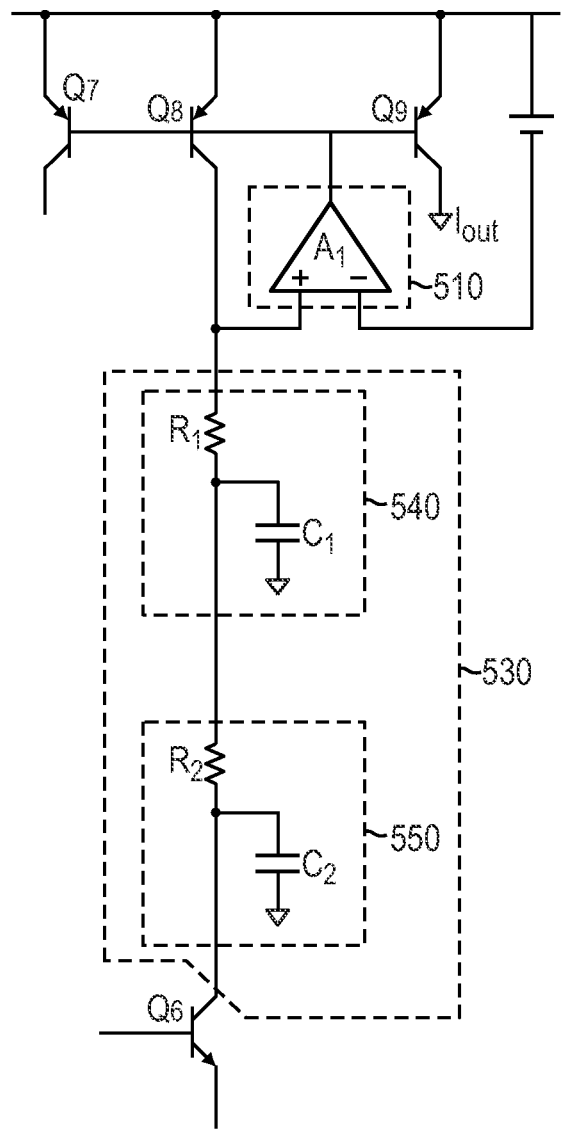
FIG. 5B illustrates detailed circuitry of the two-pole low-pass filter.
Figure 5C:
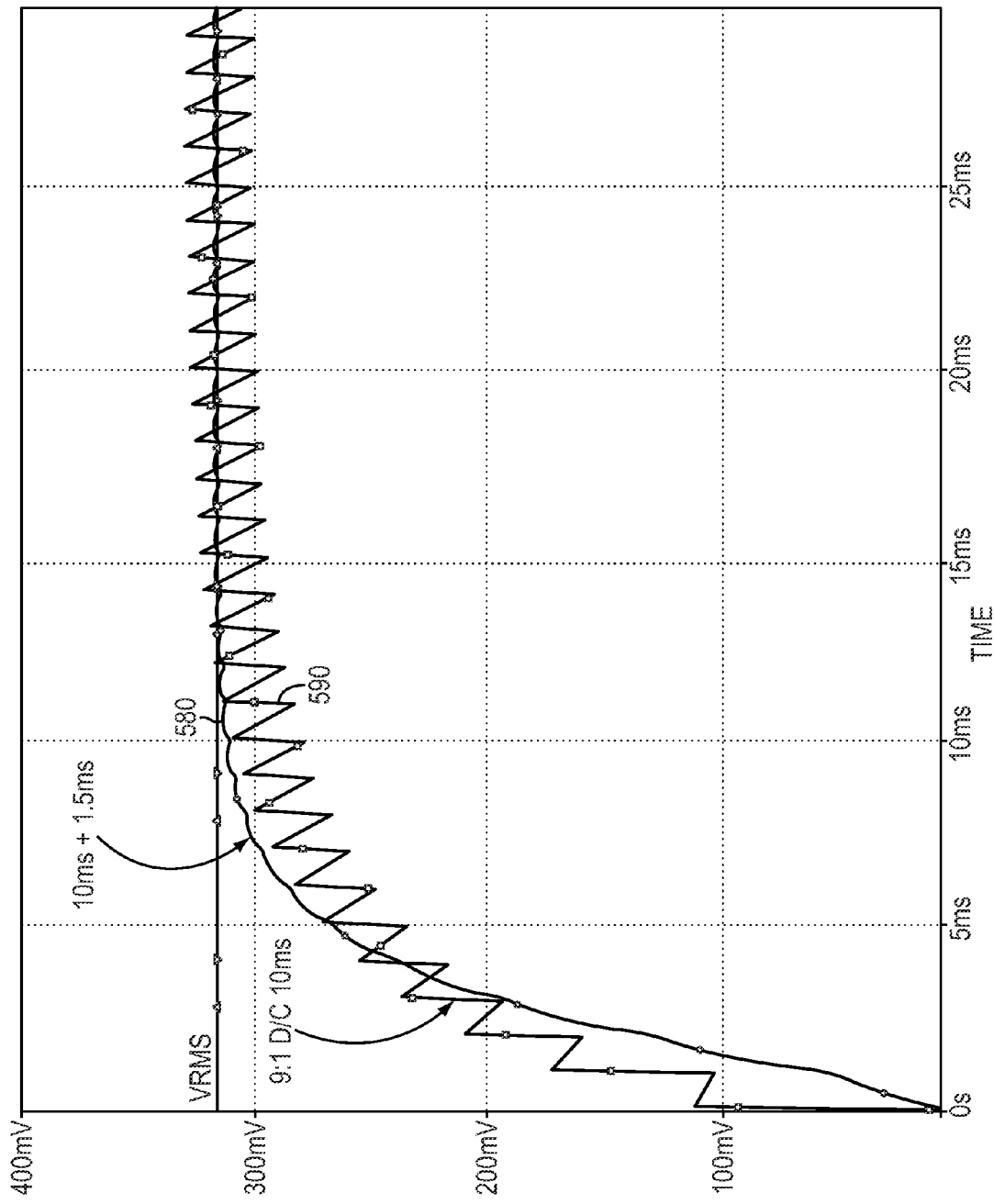
FIG. 5C depicts differences in the settling time and ripple suppression between RMS-to-DC converters incorporating a single-pole low-pass filter and a two-pole low-pass filter on a long time scale.
Figure 5D:
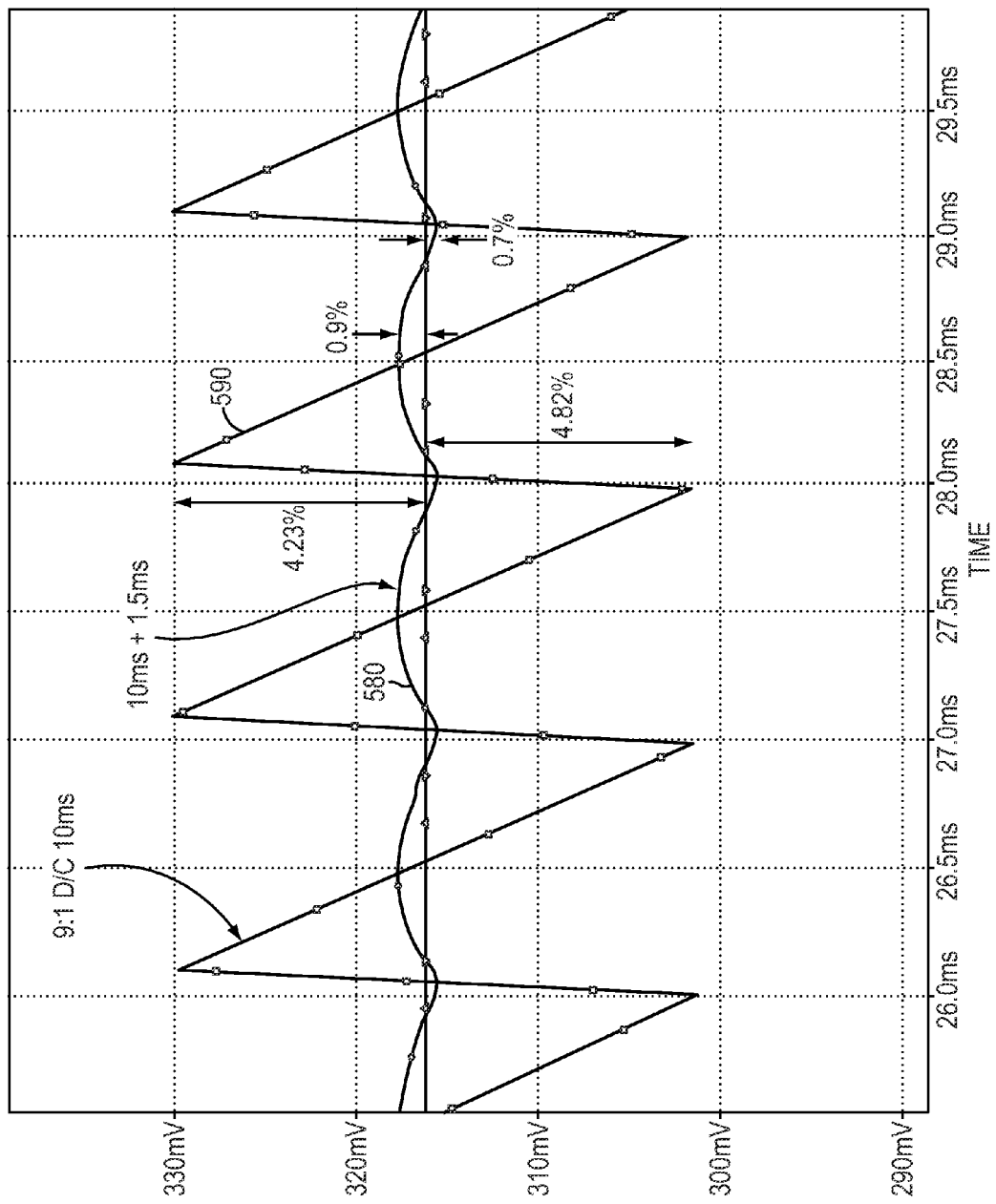
FIG. 5D quantitatively depicts the difference in ripple suppression between RMS-to-DC converters incorporating a single-pole low-pass filter and a two-pole low-pass filter on a short time scale.

With reference to FIG. 5A, an RMS-to-DC converter 500 may include an amplifier 510 to negate the effect of a variation in a dynamic emitter resistance of the transistor $Q_8$ 520 and thus maintain the filter time constant. In some embodiments, a low-pass filter 530 is incorporated in the converter 500 to reduce the output ripple. In one embodiment, the low-pass filter simply includes a resistor and a capacitor. In another embodiment, the low-pass filter 530 is a high-order filter (e.g., two-pole low-pass filter), including two low-pass filters 540, 550, as depicted in FIG. 5B. The two low-pass filters may each include a resistor connected in series with a signal and a capacitor connected between one end of the resistor and an analog common. In various embodiments, the two-pole low-pass filter is connected in series with the amplifier 510 and a transistor (e.g., $Q_6$) that squares the input signals. Each component of the two-pole low-pass filter may be located inside or outside of a housing that contains at least a part of the squarer/divider circuit 570. The high-order low-pass filters 530 again may be connected in series with the denominator computation feedback loop to reduce the output ripple, the ripple that is fedback into the denominator, and/or the DC error. In one implementation, the resistances $R_1$ and $R_2$ of the two-pole low-pass filter are 1 kΩ and 4 kΩ, respectively, and the values of $C_1$ and $C_2$ are 5 µF and 10 µF, respectively; the output ripple 580 of the converter including the two-pole low-pass filter is significantly less than the ripple 590 of the converter that incorporates a single-pole low-pass filter (having $R_1$ and $C_1$ only), as illustrated in FIG. 5C. More quantitatively, with reference to FIG. 5D, the output ripple is suppressed to 0.5% of the output signal using the two-pole low-pass filter, whereas the ripple constitutes 4.23% of the output signal using a single-pole low-pass filter. In some embodiments, the RMS-to-DC converter is operated at a low duty cycle (or high crest factor, which is defined as the ratio of peak voltage to RMS voltage), which introduces an additional error at the output signal due to the low duty cycle. In one implementation, the value of $C_1$ is adjusted to 0.1 µF while maintaining the values of $R_1$, $R_2$, and $C_2$ as 1 kΩ, 4 kΩ and 10 respectively, for reducing the introduced error and having the best crest factor performance. This is important for unexpected waveforms such as switching transients in switch mode power supplies, where most of the energy is in the peaks of the signals and can be destructive to the circuitry involved.

In general, adding an extra post-filter increases the settling time of an RMS converter and thus causes extra operational time delay. However, in the context of the present invention, the settling time of the converter incorporating the two-pole low-pass filter generally is not significantly longer than that of the converter using a single-pole low-pass filter (FIG. 5C). The present invention thus offers the ability to significantly reduce the output ripple without sacrificing the settling time.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A circuit comprising:
   a squarer/divider circuit having an output configured to generate a first current proportional to an RMS value of a time-varying input signal provided as an input to the squarer/divider circuit;
   a current mirror circuit having an input configured to receive the first current generated by the squarer/divider circuit, wherein the current mirror is configured to mirror the first current to generate a feedback current, wherein the squarer/divider circuit is configured to receive the feedback current in a denominator feedback loop, wherein the current mirror is further configured to mirror the first current to generate a DC output that is proportional to the RMS value of the time-varying input signal; and
   a high-order low-pass filter electrically connected between the output of the squarer/divider circuit and the input of the current mirror circuit, wherein the high-order low-pass filter comprises at least first and second low-pass filters connected in series to cooperatively reduce at least one of ripple in the DC output, ripple in the denominator feedback loop, or DC error in the DC output,
   wherein the current mirror circuit comprises a bipolar transistor having a collector configured to receive the first current, wherein the circuit further comprises an amplifier having a non-inverting input electrically to the collector of the bipolar transistor, an inverting input electrically connected to a reference voltage, and an output electrically connected to a base of the bipolar transistor.

2. The circuit of claim 1, further comprising:
   a voltage-to-current converter configured to convert a voltage signal into an input current;
   an absolute value circuit configured to generate the time-varying input signal based on an absolute value of the input current, wherein the squarer/divider circuit is configured to receive the time-varying input signal; and
   a translinear circuit comprising the squarer/divider circuit and the current mirror circuit.

3. The circuit of claim 2, wherein the first low-pass filter comprises at least a first resistor and a first capacitor, and the second low-pass filter comprises at least a second resistor and a second capacitor.

4. The circuit of claim 3, wherein at least one of the first resistor, the first capacitor, the second resistor and the second capacitor is located inside a housing or package that contains at least a part of the translinear circuit.

5. The circuit of claim 3, wherein at least one of the first resistor, the first capacitor, the second resistor and the second capacitor is located outside a housing or package that contains at least a part of the translinear circuit.

6. The circuit of claim 1, further comprising a post-filter configured to reduce ripple in the DC output cooperatively with the high-order low-pass filter.

7. The apparatus of claim 1, wherein the high-order low-pass filter has a first cutoff frequency and a second cutoff frequency, wherein the first and second cutoff frequencies have a separation ratio ranging between about 6:1 to about 10:1.

8. The circuit of claim 1, wherein the amplifier is further configured to maintain a filter time constant of the high-order low-pass filter.

9. A circuit for providing a DC output equal to the RMS value of a time-varying input signal, the circuit comprising:
   a squarer/divider circuit having an output configured to generate a first current proportional to an RMS value of a time-varying input signal provided as an input to the squarer/divider circuit;
   a current mirror circuit having an input configured to receive the first current generated by the squarer/divider circuit, wherein the current mirror is configured to mirror the first current to generate a feedback current, wherein the squarer/divider circuit is configured to receive the feedback current in a denominator feedback loop, wherein the current mirror is further configured to mirror the first current to generate a DC output that is proportional to the RMS value of the time-varying input signal;
   an amplifier configured to negate effects of a variation in a dynamic emitter resistance of a bipolar transistor in the current mirror circuit; and
   a low-pass filter to reduce at least one of ripple in the DC output, ripple in the denominator feedback loop, or DC error in the DC output, wherein the low-pass filter is electrically connected between the output of the squarer/divider circuit and the input of the current mirror circuit.

10. The circuit of claim 9, wherein the low-pass filter comprises a resistor and a capacitor.

11. The circuit of claim 9, wherein the low-pass filter is a high-order low-pass filter.

12. The circuit of claim 11, wherein the high-order low-pass filter comprising at least first and second low-pass filters that themselves each comprise a resistor connected in series with a signal and a capacitor connected between one end of the resistor and an analog common.

13. The circuit of claim 9, further comprising:
   a voltage-to-current converter configured to convert a voltage signal into an input current;
   an absolute value circuit configured to generate the time-varying input signal based on an absolute value of the input current, wherein the squarer/divider circuit is configured to receive the time-varying input signal; and
   a translinear circuit comprising the squarer/divider circuit and the current mirror circuit.

14. The circuit of claim 9, wherein the bipolar transistor includes a collector configured to receive the first current, wherein the amplifier includes a non-inverting input electrically to the collector of the bipolar transistor, an inverting input electrically connected to a reference voltage, and an output electrically connected to a base of the bipolar transistor.

15. The circuit of claim 12, wherein the high-order low-pass filter has a first cutoff frequency and a second cutoff frequency, wherein the first and second cutoff frequencies have a separation ratio ranging between about 6:1 to about 10:1.

16. The circuit of claim 9, wherein the amplifier is further configured to maintain a filter time constant of the low-pass filter.

17. A method of generating a DC output equal to the RMS value of a time-varying input signal, the method comprising the steps of:
- converting a voltage of the input signal into a time-varying current proportional thereto;
- generating a first current proportional to an RMS value of the time-varying current using a squarer/divider circuit;
- filtering the first current through a high-order low-pass filter comprising at least first and second low-pass filters connected in series to generate a filtered current;
- mirroring the filtered current to generate a feedback current using a current mirror;
- providing the feedback current to the squarer/divider circuit in a feedback loop; and
- mirroring the filtered current to generate the DC output using the current mirror,
- wherein the current mirror circuit comprises a bipolar transistor having a collector configured to receive the first current, wherein the method further comprises negating effects of a variation in a dynamic emitter resistance of the bipolar transistor using an amplifier, the amplifier having a non-inverting input electrically to the collector of the bipolar transistor, an inverting input electrically connected to a reference voltage, and an output electrically connected to a base of the bipolar transistor.

18. The method of claim 17, wherein the high-order low-pass filter has a first cutoff frequency and a second cutoff frequency, wherein the first and second cutoff frequencies have a separation ratio ranging between about 6:1 to about 10:1.

19. The method of claim 17, further comprising maintaining a filter time constant of the high-order low-pass filter using the amplifier.

20. An apparatus comprising:
- a squarer/divider circuit having an output configured to generate a first current proportional to an RMS value of a time-varying input signal provided as an input to the squarer/divider circuit;
- a current mirror circuit having an input configured to receive the first current generated by the squarer/divider circuit, wherein the current mirror is configured to mirror the first current to generate a feedback current, wherein the squarer/divider circuit is configured to receive the feedback current in a feedback loop, wherein the current mirror is further configured to mirror the first current to generate a DC output that is proportional to the RMS value of the time-varying input signal; and
- a means for high-order low-pass filtering electrically connected between the output of the squarer/divider circuit and the input of the current mirror circuit,
- wherein the current mirror circuit comprises a bipolar transistor having a collector configured to receive the first current, wherein the apparatus further comprises an amplifier having a non-inverting input electrically to the collector of the bipolar transistor, an inverting input electrically connected to a reference voltage, and an output electrically connected to a base of the bipolar transistor.

21. The apparatus of claim 20, wherein the high-order low-pass filtering means has a first cutoff frequency and a second cutoff frequency, wherein the first and second cutoff frequencies have a separation ratio ranging between about 6:1 to about 10:1.

22. The apparatus of claim 20, wherein the amplifier is further configured to maintain a filter time constant of the high-order low-pass filtering means.

* * * * *